(12) United States Patent
Alapuranen

(10) Patent No.: US 8,775,907 B2
(45) Date of Patent: Jul. 8, 2014

(54) ORTHOGONAL FREQUENCY DIVISION MULTIPLEXING SYMBOL DIVERSITY COMBINER FOR BURST INTERFERENCE MITIGATION

(75) Inventor: Pertti Alapuranen, Deltona, FL (US)

(73) Assignee: XG Technology, Inc., Sarasota, FL (US)

( * ) Notice: Subject to any disclaimer, the term of this patent is extended or adjusted under 35 U.S.C. 154(b) by 238 days.

(21) Appl. No.: 13/486,331

(22) Filed: Jun. 1, 2012

(65) Prior Publication Data

US 2012/0317465 A1    Dec. 13, 2012

Related U.S. Application Data

(60) Provisional application No. 61/494,509, filed on Jun. 8, 2011.

(51) Int. Cl.
*H03M 13/00* (2006.01)
*H03M 13/03* (2006.01)
*H03M 13/41* (2006.01)
*H03M 13/09* (2006.01)
H03M 13/29 (2006.01)
H03M 13/11 (2006.01)

(52) U.S. Cl.
CPC ...... *H03M 13/6306* (2013.01); *H03M 13/2906* (2013.01); *H03M 13/1102* (2013.01); *H03M 13/2933* (2013.01); *H03M 13/41* (2013.01); *H03M 13/09* (2013.01)
USPC ............................ 714/776; 714/795; 714/796

(58) Field of Classification Search
CPC . H04L 27/2647; H04L 25/067; H04L 1/0054; H04L 25/022; H04L 1/0047; H04L 1/0066; H04L 1/005; H04L 1/0668; H04L 25/0236; H04L 25/03286; H04L 1/1845; H04L 5/0007; H03M 13/31; H03M 13/09; H03M 13/41; H03M 13/2957
USPC ................ 714/776, 807, 755, 795, 758, 796; 370/208, 320, 342, 343, 203, 480, 241, 370/242; 375/341, 262
See application file for complete search history.

(56) References Cited

U.S. PATENT DOCUMENTS

| 6,950,474 B1 * | 9/2005 | Sudo ............................. 375/260 |
| 7,379,445 B2 * | 5/2008 | Guo et al. ...................... 370/343 |
| 7,675,983 B2 * | 3/2010 | Gorday et al. ................. 375/260 |
| 8,555,138 B2 * | 10/2013 | Alapuranen ................... 714/758 |
| 2008/0186842 A1 | 8/2008 | Chong et al. |

OTHER PUBLICATIONS

Win et al., "Analysis of Hybrid Selection/Maximal-Ratio Combining in Rayleigh Fading"; In: IEEE Transactions on Communications, vol. 47, No. 12, Dec. 1999, pp. 1773-1776. Retrieved Aug. 2, 2012 From Internet: http://wgroup.lids.mit.edu/publicaitons/moewin/HS-MRC-MV-TC-12-99.pdf; Entire Document.

* cited by examiner

*Primary Examiner* — Phung M Chung
(74) *Attorney, Agent, or Firm* — Dennis L. Cook, Esq.

(57) ABSTRACT

The invention disclosed in this application describes a diversity combiner that operates as a maximal ratio combiner (MRC) when no interference is detected and as a selection combiner when Orthogonal Frequency Division Multiplexing symbol errors are detected with high probability by using a symbol error detection method based on computing a symbol by symbol path error metric.

2 Claims, 1 Drawing Sheet

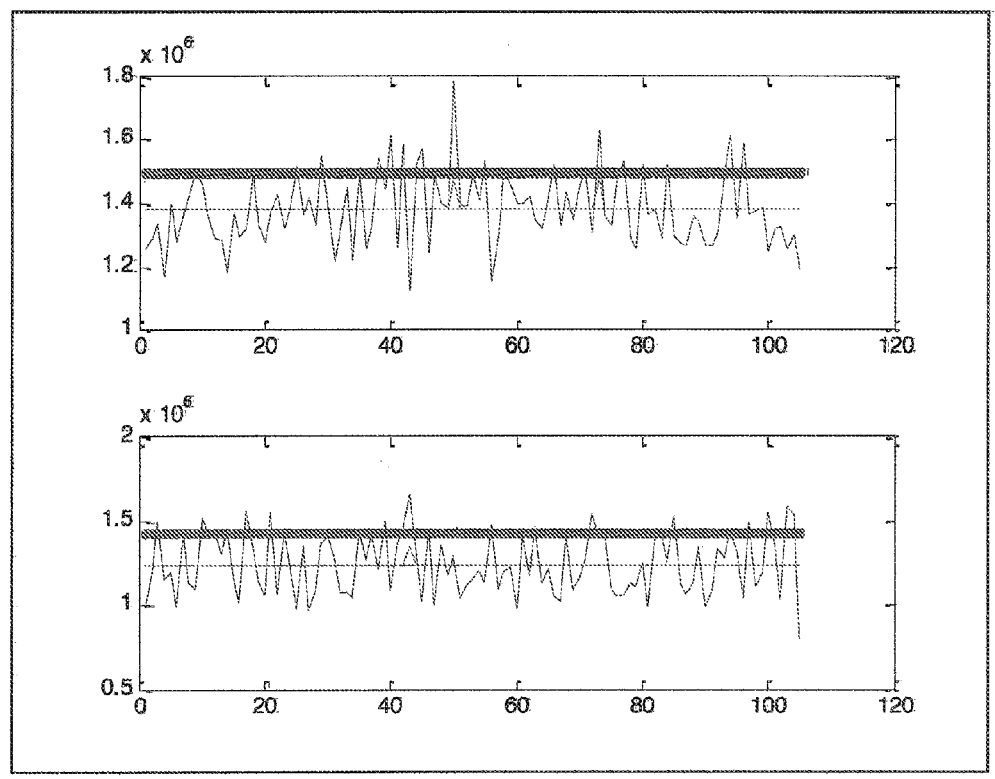

ORTHOGONAL FREQUENCY DIVISION MULTIPLEXING SYMBOL DIVERSITY COMBINER FOR BURST INTERFERENCE MITIGATION

CROSS-REFERENCE TO RELATED APPLICATION

The present application claims the benefit of previously filed Provisional Patent Application, Ser. No. 61/494,509.

FIELD OF THE INVENTION

This invention describes a method of diversity combining that operates on individual OFDM symbols allowing efficient mitigation of burst interference typical to many devices operating on unlicensed bands. More specifically this invention describes a diversity combiner that operates as a maximal ratio combiner (MRC) when no interference is detected and as a selection combiner when OFDM symbol errors are detected with a high probability.

BACKGROUND OF THE INVENTION

Classical cognitive radios change frequency channels when the radio detects that interference level or other parameters associated with operation can be improved by moving to another frequency. Modern signal processing and multiple antenna technologies, however, allow expanded cognitive operation where receiver algorithms and transmit waveforms can be instantly and dynamically adjusted for operation in a particular environment.

Radio spectrum is a limited resource. A large amount of spectrum is required to deliver services that are associated with modern wireless personal communications. Typical examples are smart phone Internet applications, wireless streaming audio, and video, to mention a few. These services consume large amounts of spectral resources causing both financial and spectrum policy issues.

Typically these services are provided using licensed spectrum. A financial burden from licensing can be billions of dollars, even for a relatively small amount of spectrum. This is a large cost compared to freely available unlicensed spectrum. The licensing, however, is required to make sure that current 1G to 4G radio technologies have the coordinated access they require to deliver quality of service that is adequate for an end user application.

Currently in United States there are several hundred MHz of unlicensed spectrum that can be used for delivering wireless services to consumers, however, traditional radio technologies typically suffer from interference from uncoordinated access from other unlicensed users. A novel radio technology is required that can deliver service while being highly resistant to interference while also creating as little interference as possible to other users in the unlicensed band.

This invention describes a diversity combiner that operates as a maximal ratio combiner (MRC) when no interference is detected and as a selection combiner when OFDM symbol errors are detected with high probability.

BRIEF SUMMARY OF THE INVENTION

This invention describes a diversity combiner that operates as a maximal ratio combiner (MRC) when no interference is detected and as a selection combiner when OFDM symbol errors are detected with high probability.

Therefore the objects of this invention include the following:

A Receiver for redundant OFDM transmission that, when failing to decode at least one of the received redundant packets, combines OFDM symbols into one packet that can be decoded error free based on estimates of OFDM symbols to contain bit errors pre FEC (Forward Error Correction) processing. The decoding method does selection or maximal ratio combining symbol by symbol for all OFDM symbols in a packet.

A method where a packet that consists of multiple OFDM symbols is processed OFDM symbol by symbol, n indicating symbol number from n=0 to n=N where N=total number of symbols −1. The OFDM symbol error detection method produces estimates for the burst errors for each OFDM symbol. The estimate is compared to a threshold to indicate if a symbol contains bit errors. If both $A_n$ and $B_n$ OFDM symbols from redundant transmissions have an OFDM symbol metric exceeding a threshold the soft bits produced from the symbols are added together. If $A_n$ exceeds the threshold but $B_n$ does not then soft bits from $B_n$ are selected to be output. Similarly, $A_n$ is selected when $B_n$ exceeds a threshold but $A_n$ does not. If both $A_n$ and $B_n$ are below a threshold then soft bits produced from the symbols are added as a function of the probability produced by the OFDM symbol estimation method.

If the decoding fails after combining then the threshold level for a symbol metric can be increased and the process can be iterated until a predetermined number of iterations have been done or the threshold has exceeded some limit, or the packet is decoded successfully.

The diversity encoding is executed only when all redundant packets contain one or more bit errors.

For a fuller understanding of the nature and objects of the invention, reference should be made to the following detailed description taken in connection with the accompanying drawing.

DESCRIPTION OF THE DRAWINGS

For a fuller understanding of the nature and objects of the invention, reference should be made to the accompanying drawing, in which:

FIG. 1 is a diagram showing an OFDM symbol path metric for two redundant packets sent at different times.

DETAILED DESCRIPTION OF THE INVENTION

The invention is based on transmission of redundant information in a form of repetition coding. Unlike traditional decoding where the receiver chooses a correctly decoded copy, the described method does selection and/or MRC combining at the OFDM symbol level. The MRC combining at a soft bit level can be done when both (or all) redundant copies of a symbol are determined to have a low probability of error.

There are many methods to implement redundancy, one form is to increase modulation rate by a factor of two and send two copies separated by some time delta. The receiver for this method can decode redundant data packets and choose the one that is correct. In reality, however, the interference in unlicensed bands is often short high power bursts, thus randomly interfering with individual OFDM symbols. In this type of interference long data packets often have one or more OFDM symbols interfered with and cannot be decoded unless a low coding rate or an impractically long time domain interleaver is used.

FIG. 1 shows an OFDM symbol path metric for two redundant packets sent at different times, separated by a small time interval. Each packet contains more than 100 OFDM symbols as indicated on the horizontal axis. The path metric is on the vertical axis. The thick line shows a threshold computed from the mean and the standard deviation with alpha=2. The symbols that have a metric that exceed the threshold are marked as potentially containing bit errors.

An improved receiver for redundant OFDM transmission can be implemented if the receiver can detect which OFDM symbols contain bit errors. This information allows the receiver to use two or more received packets with bit errors and combine symbols into one packet that can be decoded error free.

A method to identify OFDM symbol errors is described in patent application "OFDM symbol error detection method" (U.S. application Ser. No. 61/494,505) filed by the inventor of this application and incorporated herein by reference. The method indicates a probability that a specific OFDM symbol has bit errors in it when CRC after Viterbi decoding for a whole packet fails.

The combiner at the OFDM symbol level combines packets weighed by the probability of the OFDM symbol to contain errors, i.e. weighed by the information from the symbol error detection method. This information can be scaled to be between 0 and 1 where 1 means that symbol most likely contains erroneous bits due to burst interference and 0 means that metric is similar to other symbols in the packet.

If two packets, A and B, are decoded and both fail CRC indicating that after MLSE (Viterbi or other FEC) decoding both packets have one or more bit errors then the interference mitigation selection combiner is executed. For each OFDM symbol the bits produced from the symbols are identified and the output data is combined (OFDM symbol wise) according to the following rules:

1) Packet is processed OFDM symbol by symbol, n indicating symbol number from n=0 to n=N where N=total number of symbols −1.
2) OFDM symbol error detection method produces estimates for the burst errors for each OFDM symbol. The estimate is compared to a threshold to indicate if a symbol contains bit errors.
3) If both $A_n$ and $B_n$ OFDM symbols have an OFDM symbol metric exceeding a threshold the soft bits produced from the symbols are added together weighed by the metric.
4) If $A_n$ exceeds a threshold but $B_n$ does not then soft bits from $B_n$ are selected to be outputed. Similarly, $A_n$ is selected when $B_n$ exceeds a threshold but $A_n$ does not. If both $A_n$ and $B_n$ are below a threshold then soft bits produced from the symbols are added as a function of the probability produced by the OFDM symbol estimation method. In this case MRC can be used.

After selection and/or MRC processing the output is fed to forward error correction (Viterbi or another type of FEC, for example LDPC) decoder. If the decoding fails after combining the threshold level for the symbol metric can be increased and the process can be iterated until a predetermined number of iterations have been done, the threshold has exceeded some limit, or the packet is decoded successfully.

Since certain changes may be made in the above described system and method for a symbol diversity combiner without departing from the scope of the invention herein involved, it is intended that all matter contained in the description thereof or shown in the accompanying figure shall be interpreted as illustrative and not in a limiting sense.

What is claimed is:

1. A method of receiving and decoding a redundant orthogonal frequency division multiplexing (OFDM) transmission having packet A containing OFDM symbols and repeat packet B containing OFDM symbols where both whole packet A and whole packet B have failed decoding by using an interference mitigation selection combiner method wherein for each OFDM symbol the bits produced from the OFDM symbols are identified and combined according to the following method comprising:

first identifying packet A's individual OFDM symbols as packet $A_n$'s OFDM symbols and packet B's individual OFDM symbols as packet $B_n$'s OFDM symbols with n indicating a symbol number from n=0 to n=N and where N=total number of OFDM symbols −1;

then computing a cumulative packet A OFDM symbol path metric from error correction code for each OFDM symbol that produces a bit in whole packet A and a cumulative packet B OFDM symbol path metric from error correction code for each OFDM symbol that produces a bit in whole packet B;

then computing a cumulative whole packet A path metric from error correction code for all OFDM symbols that produce a bit in whole packet A and a cumulative whole packet B path metric from error correction code for all OFDM symbols that produce a bit in whole packet B;

then computing a packet A threshold by adding said cumulative whole packet A path metric's mean to a predetermined constant times the standard deviation of said cumulative whole packet A path metric and computing a packet B threshold by adding said cumulative whole packet B path metric's mean to a predetermined constant times the standard deviation of said cumulative whole packet B path metric;

then if packet $A_n$'s OFDM symbols have a cumulative packet A OFDM symbol path metric exceeding said packet A threshold and packet $B_n$'s OFDM symbols have cumulative packet B OFDM symbol path metric exceeding said packet B threshold the bits produced from said packet $A_n$'s OFDM symbols weighted by said cumulative packet A OFDM symbol path metric and added to bits produced by said packet $B_n$'s OFDM symbols weighted by said cumulative packet B OFDM symbol path metric and selected to be decoded;

then if packet $A_n$'s OFDM symbol has a cumulative packet A OFDM symbol path metric exceeding said packet A threshold but packet $B_n$'s OFDM symbol has a cumulative packet B OFDM symbol path metric that does not exceed said packet B threshold bits from packet $B_n$'s OFDM symbol are selected to be decoded;

then if packet $B_n$'s OFDM symbol has a cumulative packet B OFDM symbol path metric exceeding a said packet B threshold but packet $A_n$'s OFCM symbol has a cumulative packet A OFDM symbol path metric that does not exceed said packet A threshold bits from packet $A_n$'s OFDM symbol are selected to be decoded;

then if packet $A_n$'s cumulative packet A OFDM symbol path metric is below said packet B threshold and packet $B_n$'s cumulative packet B OFDM symbol path metric is below said packet B threshold bits produced from both packet $A_n$'s OFDM symbol and packet $B_n$'s OFDM symbol are added as a function of the probability produced by the an OFDM symbol estimation method and processed using a maximal ratio combiner and then selected to be decoded; and then final error decoding said selected bits.

2. The method of claim 1 wherein if said final error decoding fails then said threshold level is increased in predetermined increments and repeating said increasing until a predetermined maximum threshold level is met or the decoding is successful.

\* \* \* \* \*